United States Patent [19]

Mizuide

[11] Patent Number: 4,806,791
[45] Date of Patent: Feb. 21, 1989

[54] DIFFERENTIAL COMPARATOR

[75] Inventor: Yasuo Mizuide, Kawasaki, Japan

[73] Assignee: Kabushiki Kaisha Toshiba, Kawasaki, Japan

[21] Appl. No.: 119,080

[22] Filed: Nov. 10, 1987

[30] Foreign Application Priority Data

Nov. 28, 1986 [JP]  Japan .................................. 61-282132

[51] Int. Cl.$^4$ .......................... H03K 5/24; H03K 5/12
[52] U.S. Cl. .................................. 307/355; 307/290;
307/359; 307/494
[58] Field of Search ............... 307/350, 359, 362, 290,
307/355, 494

[56] References Cited

U.S. PATENT DOCUMENTS 3,988,595 10/1976 Eatock .................................. 307/362
4,408,132 10/1983 Kuwahara ........................... 307/359
4,634,897 1/1987 Yoshioka .............................. 307/359

FOREIGN PATENT DOCUMENTS 61-43014   3/1986  Japan .
61-263306 11/1986  Japan .

Primary Examiner—John Zazworsky
Attorney, Agent, or Firm—Foley & Lardner, Schwartz, Jeffery, Schwaab, Mack, Blumenthal & Evans

[57] ABSTRACT

A differential comparator of the hysteresis type is responsive to a high input difference voltage ($V_1$-$V_2$). The comparator comprises two differential transistors; a hysteresis resistor connected between the emitters of the two transistors; current source means connected to one of the emitters of the two transistors, for determining an emitter current of the two transistors directly and via the hysteresis resistor; and an emitter current controller for controlling the emitter current of the two transistors on the basis of an output current derived from an output terminal. When a voltage difference between the two input terminals reaches a balanced hysteresis voltage value, and therefore no output current flows, the output current is sharply increased in a direction opposite to the preceding direction.

6 Claims, 4 Drawing Sheets 4,806,791

DIFFERENTIAL COMPARATOR

BACKGROUND OF THE INVENTION

1. Field of the Invention

The present invention relates to a differential comparator and more specifically to a differential comparator provided with hysteresis characteristics.

2. Description of the Prior Art

Various differential comparators of hysteresis type have been well known. In general, a pair of cross-connected transistors connected to a pair of differential amplifiers function as a negative resistor to provide the above-mentioned hysteresis characteristics. However, since each of the cross-connected transistors is operated within the saturated area, the maximum input difference voltage is as low as 0.4 V, thus there exists a problem in that it is impossible to provide a differential comparator responsive to a high input difference voltage.

The circuit and operation of a prior-art differential comparator will be described in more detail hereinafter with reference to the attached drawing under DETAILED DESCRIPTION OF THE PREFERRED EMBODIMENTS

SUMMARY OF THE INVENTION

With these problems in mind, therefore, it is the primary object of the present invention to provide a differential comparator responsive to a high input difference voltage without degrading hysteresis characteristics in a relatively simple circuit configuration.

To achieve the above-mentioned object, a differential comparator of hysteresis type of the present invention comprises: (a) a first transistor having a first input base terminal; (b) a second transistor having a second input base terminal and an output collector terminal; (c) a hysteresis resistor connected between the two emitter terminals of said first and second transistors; (d) current source means connected to any one of the two emitter terminals of said two transistors, for determining an emitter current of said two transistors directly and via said hysteresis resistor, respectively; and (e) means for controlling the magnitude of the emitter current of said two transistors in response to an output current derived from the output terminal in such a way that when a voltage difference between the first and second input terminals reaches a balanced hysteresis voltage value, and therefore no output current flows, the output current ($I_0$) is sharply increased in a direction opposite to a preceding direction.

In a first embodiment of the present invention, the current source means comprises: (a) a pair of parallel-connected transistors having their common collector terminal connected to the emitter of said first or second transistor; and (b) a transistor connected to said two parallel-connected transistors in current mirror fashion. Further, the emitter current controlling means is a transistor for controlling the emitter potential of one of said parallel-connected transistors, in response to an output current signal derived from the output terminal.

In the second embodiment of the present invention, the current source means comprises: (a) a first current mirror circuit kept turned on and connected the emitter of said first or second transistor; and (b) a second current mirror circuit also connected the emitter of said first or second transistor. Further, the emitter current controlling means is a third current mirror circuit for turning on or off said second current mirror circuit on the basis of an output current signal derived from the output terminal.

In the differential comparator of the present invention, when a voltage difference between the two input terminals reaches a balanced hysteresis voltage value, and therefore no output current flows, bias currents of the differential transistors are sharply increased or decreased in response to an output current signal, so that the output current is steppedly increased in a direction opposite to the preceding direction in digital fashion.

BRIEF DESCRIPTION OF THE DRAWINGS

The features and advantages of the differential comparator according to the present invention over the prior-art comparator will be more clearly appreciated from the following description of the preferred embodiments of the invention taken in conjunction with the accompanying drawings in which like reference numerals designate the same or similar elements or sections throughout the figures thereof and in which.

DETAILED DESCRIPTION OF THE PREFERRED EMBODIMENTS

To facilitate understanding of the present invention, a brief reference will be made to a prior-art differential comparator, with reference to the attached drawing.

Conventionally, various differential comparators provided with hysteresis characteristics have been known. FIG. 1 shows a prior-art differential comparator with hysteresis characteristics configured by plural bipolar transistors.

Figure 1B:
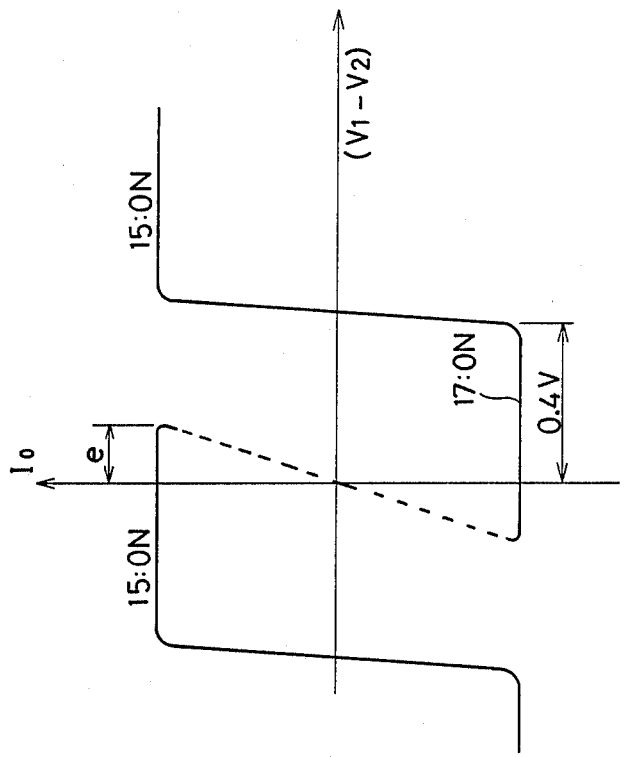
FIG. 1(B) is a graphical representation showing hysteresis characteristics of the comparator shown in FIG. 1(A)
Figure 1A:
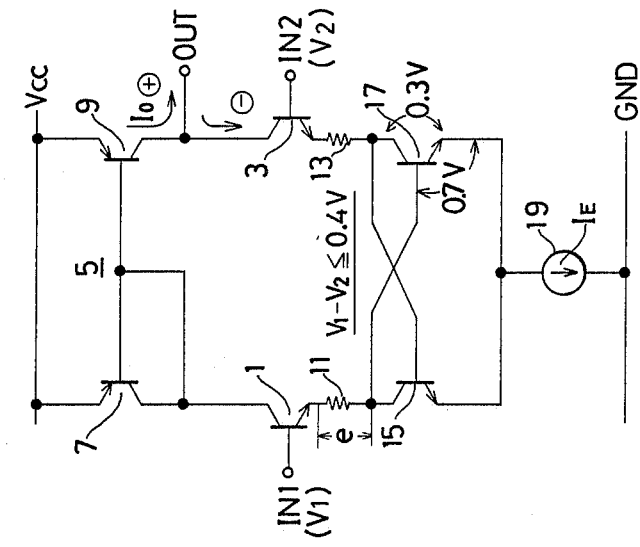
FIG. 1(A) is a circuit diagram showing an example of prior-art differential comparators.

In FIG. 1(A), two NPN transistors 1 and 3 form a differential circuit. A first input terminal IN1 is connected to the base of the transistor 1, while a second input terminal IN2 is connected to the base of the transistor 3.

On the other hand, two PNP transistors 7 and 9 forming a current mirror circuit 5 are connected to the differential circuit 1, 3 as a load circuit in such a way that each collector terminal of each PNP transistor 7 or 9 is connected with each collector terminal of each differential transistor 1 or 3. The emitter terminals of the PNP transistors 7 and 9 are connected to a supply voltage $V_{cc}$, and the base terminal thereof (7 and 9) are connected to each other and further to the collector terminal of the PNP transistor 7. An output terminal OUT is connected to a junction point of the two collectors of the two transistors 3 and 9.

Further, a pair of symmetrically cross-connected NPN transistors 15 and 17 are connected to the differential circuits 1 and 3. In more detail, each emitter terminal of the differential NPN transistors 1 and 3 is connected to each collector terminal of these symmetrical NPN transistors 15 and 17 via resistors 11 and 13, respectively. Further, each collector terminal of the NPN transistors 15 and 17 is connected to each base terminal of the NPN transistors 17 and 15 in cross connection manner. Furthermore, two mutually-connected emitter terminals of the NPN transistors 15 and 17 are connected to a current source 19 so as to form a symmetrical circuit.

In the prior-art differential comparator as described above, the symmetrical NPN transistors 15 and 17 function as a negative-resistance element with respect to the emitter currents of the differential transistors 1 and 3, thus providing hysteresis characteristics in response to a difference voltage $(V_1-V_2)$ of two input voltages $V_1$ and $V_2$ applied to the two input terminals IN1 and IN2, respectively.

In operation, a reference input voltage $V_2$ is applied to the second input terminal IN2, and an input voltage $V_1$ is applied to the first input terminal IN1. Under these balanced conditions, when only the input voltage $V_1$ increases, the base potential of the transistor 1 rises, so that the emitter potential of the transistor 1 also rises. By this, the base potential of the transistor 17 increases and also the emitter potential thereof 17 rises with increasing base potential (there exists a voltage drop $(V_{BE}=0.7 V)$ between the base and the emitter).

On the other hand, since the reference input voltage $V_2$ is kept constant, the base potential of the transistor 15 will not change. Therefore, as the emitter potential increases at the transistor 17, in the transistor 15, the base potential coincides with the emitter potential.

When the input voltage $V_1$ further increases, and therefore the emitter potential of the transistor 17 further rises, in the transistor 15, the emitter potential becomes higher than the base potential (the transistor 15 is turned off and the transistor 17 is turned on). Since the base-emitter potential of the transistor 15 is the same as the collector-emitter potential of the transistor 17, the transistor 17 is operated in a saturation zone.

Therefore, the maximum input difference voltage to operate the transistor 17 outside the saturation zone is about 0.4 V $(=V_{BE}-V_{CES})$, when the base-emitter voltage $V_{BE}$ is approximately 0.7 V and the collector-emitter saturation voltage $V_{CES}$ is approximately 0.3 V.

Further, where the input voltage $V_1$ is decreased with the reference input voltage $V_2$ kept unchanged, the operation is quite the same as when the input voltage $V_2$ is increased with the reference input voltage $V_1$ keep unchanged. In this case, the maximum input difference voltage is also about 0.4 V.

FIG. 1(B) indicates the on-and-off operation of the differential comparator shown in FIG. 1(A). In the drawing, when the transistor 15 is turned on, since the transistor 17 is off, the output terminal current $I_0$ flows toward the outside in the direction shown by a positive mark. Under these conditions, where $(V_1-V_2)$ is increased beyond e determined across the resistor 11, the transistor 17 is turned on as shown, so that the output terminal current $I_0$ flows toward the inside in the direction shown by a negative mark. Further, when the input difference voltage $(V_1-V_2)$ is increased up to 0.4 V, the transistor 15 is turned on again and the transistor 17 is turned off again as shown. Therefore, to operate the differential amplifier in hysteresis mode, the input difference voltage $(V_1-V_2)$ is limited within a range of as low as 0.4 V.

As described above, in the prior-art differential comparator, there exists a problem in that the input difference voltage is limited and therefore it is impossible to compare two voltages having a higher difference voltage.

In view of the above description, reference is now made to a basic embodiment of the differential comparator according to the present invention.

Figure 2A:
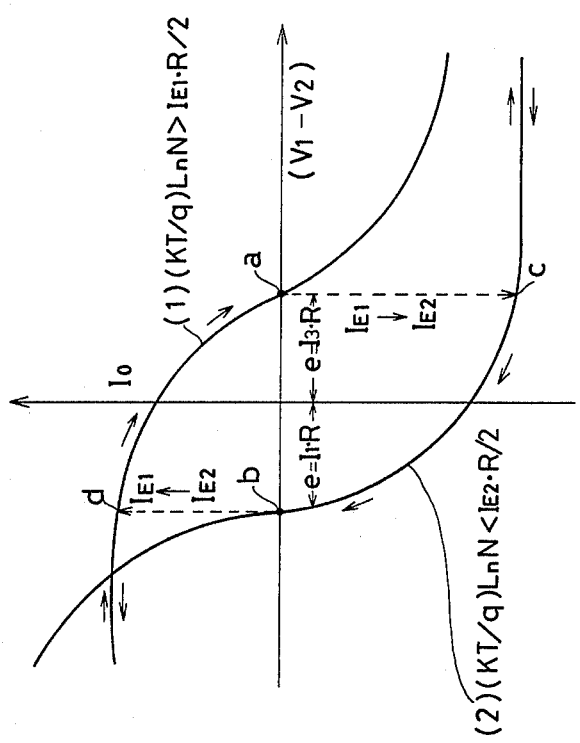
FIG. 2(A) is a schematic circuit diagram showing a basic embodiment of the differential comparator according to the present invention.

FIG. 2(A) shows a circuit diagram of the basic embodiment of the differential comparator according to the present invention, in which the same references as in FIG. 1(A) have been retained for similar elements which have the same functions, without repeating the description thereof.

The feature of the differential comparator shown in FIG. 2(A) is to control a bias current flowing through the emitter terminals of the two NPN differential transistors 1 and 3 by a current source 23 whose current can be controlled by a controller 25 in response to an output current $I_0$ derived from the output terminal OUT such that hysteresis characteristics can be attained.

In FIG. 2(A), the two NPN transistors 1 and 3 constitute a differential comparator; the two PNP transistors 7 and 9 constitute a current mirror circuit 5 as a load of the differential comparator. A first input terminal IN1 is a base terminal of the first differential NPN transistor 1; a second input terminal IN2 is a base terminal of the second differential NPN transistor 3; and an output terminal OUT is a collector terminal of the second differential transistor 3.

A resistor 21 is connected between the two emitter terminals of the two differential transistors 1 and 3, and a current source 23 is connected between the emitter terminal of the transistor 1 and the ground GND to determine a bias current of transistors 1 and 3.

A controller 25 is connected between the current source 23 and the output terminal OUT so as to control the magnitude of current, to be passed through the current source 23, on the basis of an output current $I_0$ flowing through the output terminal OUT.

The operation of the differential comparator shown in FIG. 2(A) will be described hereinbelow with reference to FIG. 2(B).

The feature of this circuit configuration is to realize an asymmetrical differential comparator having an offset voltage with respect to two input voltages $V_1$ and $V_2$ whereby hysteresis characteristics can be realized.

The above input offset voltage $(V_1-V_2)$ (which is a function of an emitter current $I_E$) will first be described hereinbelow. Where the collector current of the transistor 9 is designated as $I_{C9}$ and that of the transistor 3 is designated as $I_{C3}$, the output current $I_0$ is a difference between the two and can be expressed as $I_0=I_{C9}-I_{C3}$. Here, if the emitter area ratio (current density ratio) of the transistors 7 and 9 is 1:1, the collector current $I_{C1}$ of the transistor 1 or the collector current $I_{C7}$ of the transistor 7 is equal to $I_{C9}$ as $I_{C1}=I_{C7}=_{C9}$ on the basis of the characteristics of the current mirror circuit 5. Therefore, if $I_{C1}=I_{C3}$, $I_0=0$, so that $I_{C1}$ or $I_{C3}$ is $I_E/2$ where $I_E$ denotes a current flowing through the current source 23.

Under these balanced conditions, the input difference voltage $(V_1-V_2)$ can be expressed as $$V_1 - V_2 = V_{BE1} - I_{C3}R - V_{BE3}$$
$$= (KT/q) Ln (I_{C1}/I_S) - I_{C3}R$$
$$- (KT/q) Ln (I_{C3}/NI_S)$$
$$= (KT/q) LnN - I_{C3}R$$
$$= (KT/q) LnN - (I_ER/2)$$

where $V_{BE}$ denotes a base-emitter voltage; N denotes an emitter area ratio of the transistor 3 to the transistor 1; q denotes the electron charge; K denotes the Boltzman's constant; T denotes absolute temperature; $I_S$ denotes the saturation collector current.

The above input difference voltage ($V_1-V_2$) is an input offset voltage which depends upon current $I_E$ flowing through the current source 23.

Figure 2B:
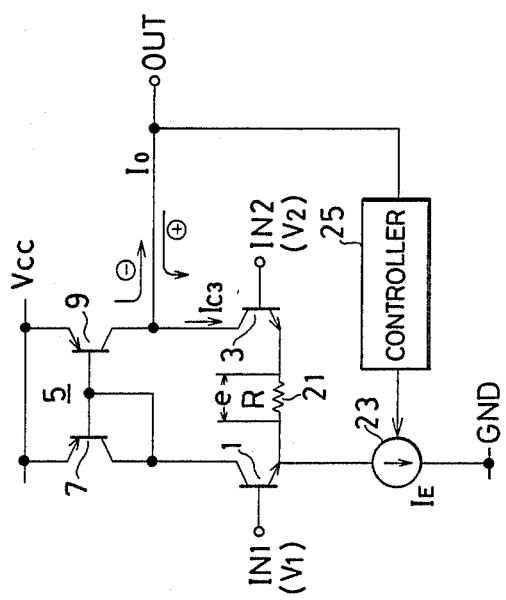
FIG. 2(B) is a graphical representation showing hysteresis characteristics of the comparator shown in FIG. 2(A)

Here, if the emitter current $I_E$ flowing through the current source 23 is determined as $(KT/q)LnN > I_{E1}R/2$, the input difference voltage ($V_1-V_2$) is positive and the relationship between ($V_1-V_2$) and the output current $I_0$ (the direction of $I_0$ is determined positive when flowing toward the collector terminal of the transistor 3) can be represented by a curve (1) as shown in FIG. 2(B) and further the input offset voltage is $e = I_3 \cdot R$ at point a located on the positive side.

Further, if the emitter current $I_E$ is increased to $I_{E2}$ ($>I_{E1}$) as $(KT/q)LnN < I_{E1}R/2$, the input difference voltage ($V_1-V_2$) becomes negative and the relationship between ($V_1-V_2$) and $I_0$ can be represented by a curve (2) as shown in FIG. 2(B), and further the input offset voltage is $e = I_3 \cdot R = I_1 \cdot R$ at point b on the negative side.

Here, the emitter current flowing through the current source 23 is fixed to $I_{E1}$ and only the input difference voltage ($V_1-V_2$) is increased. When the output current $I_0$ begins to flow in the negative direction at point a, the controller 25 detects this timing and increases the current from $I_{E1}$ to $I_{E2}$ to increase $I_{C1}$ as compared with $I_{C3}$, so that the output current $I_0$ flows from the collector of the transistor 9 to the outside through the output terminal OUT. In FIG. 2(B), the current $I_0$ changes from point a to c at this moment.

Further, the emitter current flowing through the current source 23 is fixed to $I_{E2}$ and the input difference voltage ($V_1-V_2$) is decreased. When the output current $I_0$ begins to flow in the positive direction at point b, the controller 25 detects this and decreases the current from $I_{E2}$ to $I_{E1}$, so that the output current $I_0$ flows from the output terminal to the collector of the transistor 3. In FIG. 2(B), the current $I_0$ changes from point b to point d. As described above, it is possible to obtain hysteresis characteristics of the output current $I_0$ by increasing or decreasing the emitter current $I_E$ flowing through the current source 23.

In the above circuit configuration, since the bias current of the two differential transistors 1 and 3, responsive to two input voltages, is controllably passed through the current source 23, the maximum range of the input difference voltage is the reverse breakdown voltage between base and emitter $V_{EB0}$ (about 7 V, except some limitations at supply potential and ground potential, thus remarkably increasing the allowable input difference voltage as compared with that (0.4 V) of the prior-art differential comparator.

Figure 3:
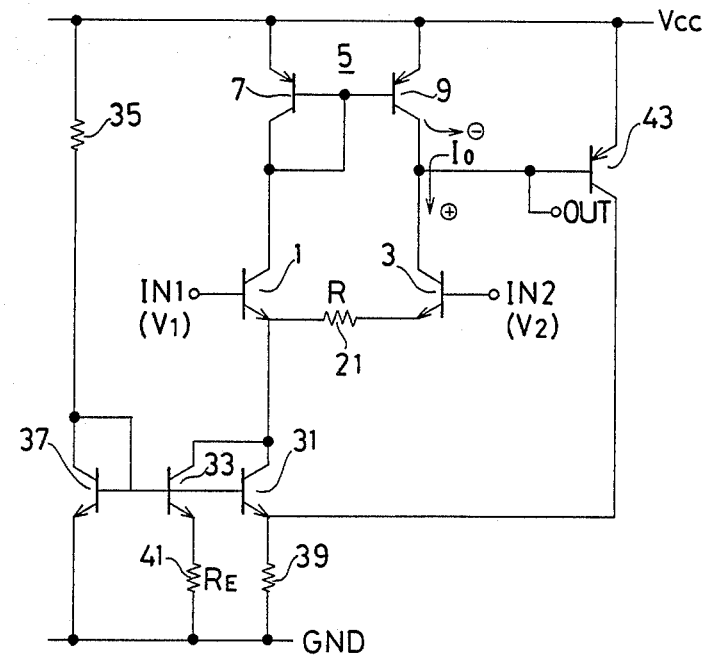
FIG. 3 is a circuit diagram showing a practical circuit configuration of the comparator shown in FIG. 2(A)

FIG. 3 is a circuit diagram of a first embodiment of the differential comparator of the present invention, in which the emitter current of the two differential transistors 1 and 3 can be controlled by two NPN transistors 31 and 33 on the basis of the output current $I_0$.

In FIG. 3, a pair of NPN transistors 31 and 33 form a current mirror circuit in cooperation with an NPN transistor 37. The base and collector terminals of the transistor 37 are connected to a supply voltage $V_{cc}$ via a resistor 35 and the emitter thereof is connected to the ground GND. The base terminals of the two transistors 31 and 33 are connected to the base terminal of the transistor 37, and the collector terminals of 31 and 33 are connected to the emitter terminal of the transistor 1. The emitter terminal of the transistor 31 is connected to ground GND via a resistor 39, and the emitter terminal of the transistor 33 is connected to the ground GND via a resistor 31. Further, the transistor 43 is connected to the output terminal OUT of the differential transistor 3. That is, the base terminal of the transistor 43 is connected to the collector terminal of the transistor 3; the emitter terminal thereof is connected to the supply voltage $V_{cc}$; the collector terminal thereof is connected to the emitter of the transistor 31.

In the differential comparator as described above, when the input difference voltage ($V_1-V_2$) is lower than $e = I_3 \cdot R$ of point a, since the output current $I_0$ is positive, $I_{C3} > I_{C1}$, so that the output current $I_0$ flows into the collector terminal of the transistor 3 to turn on the transistor 43. Therefore, the collector current $I_{C43}$ of the transistor 43 flows through the resistor 39 to ground GND, and therefore the emitter potential of the transistor 31 rises to turn off the transistor 31. Therefore, under these conditions, the emitter current $I_E$ of the two differential transistors 1 and 3 is the collector current ($I_{C33} = I_{E1}$) of the turned-on transistor 33.

When the input difference voltage ($V_1-V_2$) further increases to point a in FIG. 2(B), since $I_0$ becomes negative, $I_{C3} < I_{C1}$, so that the output current $I_0$ flows to the base terminal of the transistor 43 to turn off the transistor 43. Therefore, the emitter potential of the transistor 31 drops to turn on the transistor 31. Therefore, under these conditions, the emitter current $I_E$ of the two differential transistors 1 and 3 is an addition of the collector current $I_{C31}$ of the transistor 31 and the collector current $I_{C33}$ of the transistor 33, so that the emitter current increases from ($I_{C33} = I_{E1}$) to ($I_{C33} + I_{C31} = I_{E2}$). Therefore, the output current $I_0$ increases as shown at point c (at which the negative current $I_0$ flows) in FIG. 2(B).

Under these conditions, when the input difference voltage ($V_1-V_2$) decreases and therefore the output current $I_0$ decreases to point b along the line (2), the transistor 43 is turned on and therefore the transistor 31 is turned off. By this, the emitter current of the two differential transistors 1 and 3 decreases from $I_{E2}$ to $I_{E1}$ and therefore the output current $I_0$ changes to point d (at which the positive current $I_0$ flows) as shown in FIG. 2(B). As described above, the relationship between the output current $I_0$ and the input difference voltage ($V_1-V_2$) represents hysteresis characteristics.

In the above formula which represents the input offset voltage as $V_1-V_2=(KT/q)LnN-(I_E \cdot R/2)$, the factors in the first term and the second term contain different variables. However, in the circuit shown in FIG. 3, $I_{C33}$ can be expressed as $$I_{C33} = (1/R_E) \times (KT/q) \times Ln(I_{C37}/I_{C33})$$

Therefore, ($I_{C33}R/2$) can be expressed as $$(I_{C33}R/2) = (R/2R_E) \times (KT/q) \times Ln\ (I_{C37}/I_{C33})$$

Therefore, if $(R/2R_E)$ is determined constant, the first and second terms include the same coefficient $(KT/q)$, thus allowing the cancellation of the influence of temperature, dispersion, etc. upon the circuit.

Figure 4:
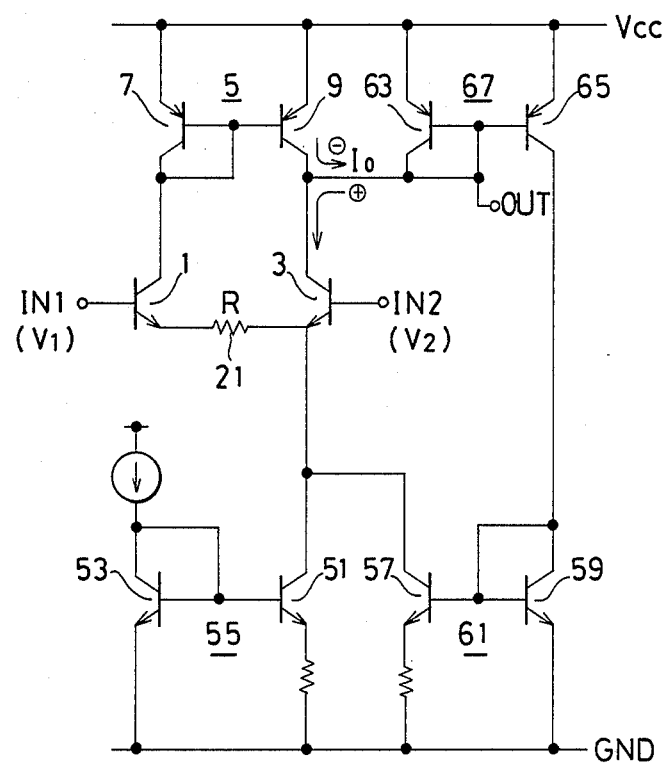
FIG. 4 is a circuit diagram showing another practical circuit configuration of the differential comparator according to the present invention.

FIG. 4 shows a second embodiment of the differential comparator of the present invention. In this embodiment, the bias current of the two differential transistors 1 and 3 is determined on the emitter side of the transistor 3. In this embodiment, the input offset voltage $(V_1 - V_2)$ can be expressed as $$V_1 - V_2 = (I_E \cdot R/2) - (KT/q)LnN$$

where N denotes a ratio of transistors 1 to 3 in emitter area.

Therefore, when the emitter current $I_E$ of the two transistors 1 and 3 is increased, the input offset voltage is shifted to the positive side (from b to d in FIG. 2B).

In FIG. 4, three current mirror circuits 55, 61, and 67 are incorporated. A first mirror circuit 55 composed of two NPN transistors 51 and 53 (turned on at all times) is connected to the emitter terminal of the transistor 3. A second mirror circuit 61 composed of two NPN transistors 57 and 59 is connected also to the emitter terminal of the transistor 3 to control the emitter current of the two transistors 1 and 3. Further, a third mirror circuit 67 composed of two PNP transistors 63 and 65 is connected to the output terminal OUT to control the mirror circuit 61 on the basis of the output current $I_0$.

In this second embodiment, when $V_1 < V_2$ or $V_1 - V_2 < 0$ and $V_1$ is increased, the output current $I_0$ begins to flow in the positive direction, the current mirror circuit 67 is turned on and therefore the current mirror circuit 61 is also turned on, so that the emitter current $I_E$ of the two transistors 1 and 3 increases. In this case, the output current $I_0$ shifts to the positive side.

In contrast with this, when $V_1 < V_2$ or $V_1 - V_2 < 0$ and $V_2$ is decreased, the output current $I_0$ begins to flow in the negative direction, the current mirror circuit 67 is turned off and therefore the curent mirror circuit 61 is also turned off, so that the emitter current $I_E$ of the two transistors 1 and 3 decreases. In this case, the output current $I_0$ shifts to the negative side, being different from the case shown in FIG. 2(B).

In summary, the emitter current $I_E$ of differential transistors 1 and 3 can be increased or decreased according to the change in input difference voltage $(V_1 - V_2)$. It is possible to obtain hysteresis characteristics.

As described above, in the differential comparator of the present invention, in which two transistors are connected via a resistor so as to form a differential pair, since the bias currents, flowing directly through one transistor and indirectly through the other transistor via the resistor, is controlled according to the output signal, it is possible to provide a differential comparator of the hysteresis type which is response to high input difference voltage.

What is claimed is:

1. A differential comparator of hysteresis type, which comprises:
   (a) a first switching element having a first input terminal to which a first input signal is applied;
   (b) a second switching element having a second input terminal to which a second input signal is applied and an output terminal from which an output signal is outputted;
   (c) a hysteresis resistor connected between the first and second switching elements;
   (d) current source means, for determining bias currents, connected to one switching element directly and to the other switching element via said hysteresis resistor; and
   (e) means for increasing/decreasing the bias current in response to said output signal from the output terminal in such a way that when a voltage difference between the first input terminal and the second input terminal reaches a balanced hysteresis voltage value, and therefore no output current flows, the output current is sharply increased in a direction opposite to a preceding direction.

2. A differential comparator of hysteresis type, which comprises:
   (a) a first transistor having a first input base terminal;
   (b) a second transistor having a second input base terminal and an output collector terminal;
   (c) a hysteresis resistor connected between the emitter terminals of said first and second transistors;
   (d) current source means connected to either emitter terminal of said two transistors for determining an emitter current of said two transistors directly and via said hysteresis resistor; and
   (e) means for controlling the magnitude of the emitter current of said two transistors in response to an output collector current derived from the output terminal, in such a way that when a voltage difference between the first input terminal and the second input terminal reaches a balanced hysteresis voltage value, and therefore no output current flows, the output current is sharply increased in a direction opposite to a preceding direction.

3. The differential comparator of hysteresis type as set forth in claim 2, wherein said current source means comprises:
   (a) A pair of parallel-connected transistors having their common collector terminal connected to one of the emitters of said first and second transistors; and
   (b) a transistor connected to said two parallel-connected transistors in current mirror fashion.

4. The differential comparator of hysteresis type as set forth in claim 3, wherein said emitter current controlling means comprises a transistor for controlling the emitter potential of one of said parallel-connected transistors in response to an output current signal derived from the output collector terminal.

5. The differential comparator of hysteresis type as set forth in claim 2, wherein said current source means comprises:
   (a) a first current mirror circuit kept turned on and connected to the emitter of said first or second transistor; and
   (b) a second current mirror circuit also connected to the emitter of said first or second transistor.

6. The differential comparator of hysteresis type as set forth in claim 5, wherein said emitter current controlling means comprises a third current mirror circuit for turning on or off said second current mirror circuit on the basis of an output current signal derived from the output terminal

* * * * *